United States Patent [19]

Berenholz et al.

[11] Patent Number: 5,168,919
[45] Date of Patent: Dec. 8, 1992

[54] AIR COOLED HEAT EXCHANGER FOR MULTI-CHIP ASSEMBLIES

[75] Inventors: Jack Berenholz, Lexington; John K. Bowman, Brighton, both of Mass.

[73] Assignee: Digital Equipment Corporation, Maynard, Mass.

[21] Appl. No.: 546,118

[22] Filed: Jun. 29, 1990

[51] Int. Cl.⁵ .................. F28D 15/02; H01L 23/427
[52] U.S. Cl. .................. 165/80.4; 165/80.3; 165/104.33; 165/185; 361/383; 361/385; 361/386
[58] Field of Search .................. 165/80.4, 104.33, 185, 165/803; 361/385, 386, 383

[56] References Cited

U.S. PATENT DOCUMENTS

| | | | |
|---|---|---|---|
| 3,476,175 | 11/1969 | Plevyak | 165/104.33 |
| 3,716,759 | 2/1973 | Scace et al. | 361/386 |
| 4,768,581 | 9/1988 | Gotwald et al. | 165/80.3 |
| 4,899,256 | 2/1990 | Tin | 361/386 |
| 4,944,344 | 7/1990 | Crowe | 165/104.33 |

OTHER PUBLICATIONS

Dombrowskas, R. J. et al. Conduction Cooled Heat Plate . . . , IBM Tech. Disclosure Bulletin, vol. 13, No. 2, p. 442 Jul. 1970.
Bauman, A. H. *Multimodule Heat Sink*, IBM Technical Disclosure Bulletin, vol. 19, No. 8, Jan. 1977 pp. 2976–2977.

*Primary Examiner*—Albert W. Davis, Jr.
*Attorney, Agent, or Firm*—Clayton L. Satow; Ronald E. Myrick; Barry N. Young

[57] ABSTRACT

An air-cooled self-contained evaporator and condenser apparatus with no external power source, the apparatus including a cold plate having a first surface with recesses formed therein in a matrix or array corresponding to the matrix or array of chips on a multi-chip module or unit. The opposite surface of the cold plate includes a finned arrangement which, in conjunction with the cold plate, forms part of an isolated evaporation chamber of the cooling unit, with the chamber housing a boilable fluid which changes phase from liquid to vapor. Positioned above and contiguous with the isolated chamber is a condensing chamber, including a plurality of tubular passageways, the external portions of which are finned for ready removal of heat. For attachment of the cold plate portion of the unit to the chips, suitable heat transfer slugs, such as aluminum nitride slugs, are affixed in the recesses, with opposites surfaces thereof bonded to the exposed faces of the chips. Heat is transferred from the chips through the slugs, through the cold plate to cause boiling of the fluid within the chamber, the vapors of which are condensed in the upper part of the cooling unit to thus return as fluid to the chamber.

16 Claims, 2 Drawing Sheets

AIR COOLED HEAT EXCHANGER FOR MULTI-CHIP ASSEMBLIES

BACKGROUND OF THE INVENTION

This invention relates to a method and apparatus for air cooling of integrated circuit computer chips and more particularly to a method and apparatus for air cooling an array of such chips by utilization of an air-cooled evaporator and condenser apparatus, the evaporator and condenser being self-contained and requiring no external power source.

With high power computers of modern design, there is a need to meet market demands for air-cooling of such high power computer systems. Attempts to use air to cool extremely high powered semiconductor devices or chips have proven inefficient, since air is not a highly efficient heat transfer medium. Heat transfer from a high powered chip to an air cooled system requires a very large heat dissipation area or heat sink. Modern chip packaging techniques, which allow for the housing of several high powered chips in a very compact area, creates the problem of requiring a large heat sink area for heat dissipation.

Attempts have been made to use liquid cooling as a means of cooling high powered chips. However, liquid cooling requires pumps and tubing, and, in most instances, an additional cabinet to accommodate this type of cooling. In addition, customers for such computers exhibit low confidence in liquid cooling.

One such attempt at liquid cooling for electronic components is direct immersion ebullient heat transfer, whereby the semiconductor components are totally immersed within a dielectric liquid. The degree of cooling depends on finding a dielectric liquid with suitable phase-change and dielectric characteristics. Another immersed component cooling system traditionally utilizes a finned condenser coil within the vapor space for heat removal. Condensers for such ebullient systems can be located in the vapor space above the components or located remotely.

Other systems, such as the Cray 2 computer, utilize a forced convection direct immersion system which does not boil. The liquid flows past the components, where it picks up heat and then flows to an external heat exchanger where it is cooled. The fluid flow in this system requires pumps and external tubing.

With systems having the integrated circuit chips immersed in a coolant or boilable liquid, care must be taken in selection of the liquid, that is, the dielectric and corrosive properties of the liquid, along with the heat transfer characteristics and vapor phase change temperature, must be considered in providing a highly reliable cooling system.

Other systems have employed conventional finned heat sink structures, in an air-cooled arrangement, but such systems are usable only for low power dissipation devices. Since air is not a very efficient cooling medium, the amount of heat removed is low. Thus, unless a higher air contact area is provided, this approach is suitable only for relatively low powered chips.

In accordance with an aspect of the invention, a multi-chip module is provided with a self-contained mechanically attachable cooling unit.

SUMMARY OF THE INVENTION

The foregoing and other objects and features of the present invention are accomplished by providing an air-cooled self-contained evaporator and condenser apparatus with no external power source, the apparatus including a cold plate having a first surface with recesses or chip sites formed therein in a matrix or array corresponding to the matrix or array of chips on a multi-chip module or unit. The opposite surface of the cold plate includes a finned arrangement which, in conjunction with the cold plate, forms part of an isolated evaporation chamber of the cooling unit, with the chamber housing a boilable fluid which changes phase from liquid to vapor. Positioned above and contiguous with the isolated chamber is a condensing chamber, including a plurality of tubular passageways, the external portions of which are finned for ready removal of heat. For attachment of the cold plate portion of the unit to the chips, suitable heat transfer slugs, such as aluminum nitride slugs, are soldered into the recesses, with opposite surfaces thereof suitably bonded to the exposed faces of the chips. Heat is transferred from the chips through the slugs, through the solder attachment, through the cold plate to cause boiling of the fluid within the chamber, the vapors of which rise to the condensing chamber in the upper part of the cooling unit where the vapor is condensed and returned as liquid to the evaporator chamber.

Other objects, features and advantages of the invention will become apparent from a reading of the specification, when taken in conjunction with the drawings, in which like reference numerals refer to like elements in the several views.

DESCRIPTION OF THE PREFERRED EMBODIMENT

Figure 1:
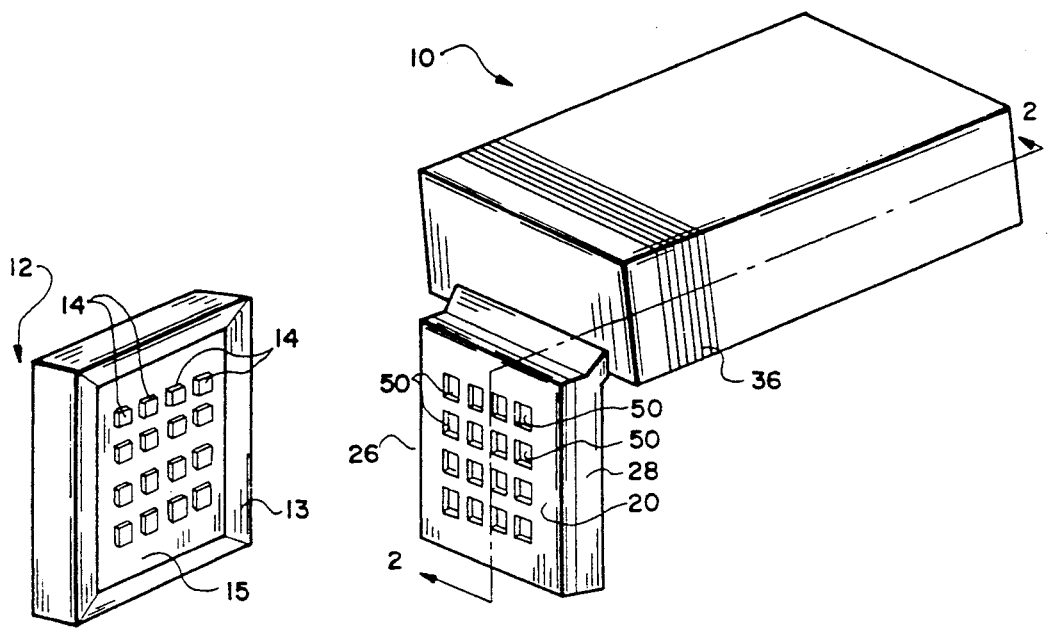
FIG. 1 is an isometric view of the cooling apparatus according to the invention, shown in exploded relation to a face of a multi-chip module.

Referring now to the drawings, in FIG. 1, there is shown an air-cooled self-contained evaporator and condenser apparatus, generally designated 10, the apparatus 10 being shown adjacent a multi-chip unit, generally designated 12, the unit 12 being rotated about a vertical axis for illustration of the face thereof having semiconductor chips 14 assembled thereon.

Briefly, by reference to FIGS. 1 and 2, the apparatus 10 is an air-cooled self-contained heat exchanger or cooling unit with internally formed chambers and passageways configured, dimensioned, adapted and oriented to provide a hermetically sealed evaporation and condensing unit which, as will be described, when thermally attached to a matrix of integrated circuit chips, enables the dissipation of large amounts of heat without external sources of power, without tubing and without pumps or other mechanical or electrical devices.

The unit 10 is a hermetically sealed unit which includes an isolated boilable fluid evaporating chamber 16 which is generally box-like in form with an open top and includes a generally plate-shaped, generally rectangular, cold plate member 20 in generally parallel spaced relation to a like configured back wall member 22. The cold plate member 20 contains, on the boiler side, an array of fins 21 which augment the heat transfer surface area on the boiler side for reasons which will hereafter become obvious. A bottom wall 24 and sidewalls 26, 28 interconnect the opposing edges of the cold plate member 20 and back wall member 22 to define the open-topped chamber 16.

The chamber 16 is provided with an open top or passageway 30, which, in accordance with the embodiment illustrated, is formed at an angle from the attachment face of the cold plate 20. The passageway 30 is formed as a duct like portion, which connects with an upper receiving chamber, generally designated 32, which includes, as part thereof, a plurality of tubular or other condensing passageways 34, projecting from and in flow communication with the chamber 32, with each of the tube-like passageways 34 being formed of tubular or other members with fins 36 about the exterior thereof. Other fins may suitably be affixed to the interior walls of the passageways 34, if desired. The tube-like condensing passageways 34 serve as a condensing chamber, with passageways 34 being elongate, open in the area of the receiving chamber 32 and capped, plugged, or otherwise terminated at the opposite end by cap members 34a, or U-shaped bends, or the like. With U-shaped bends, essentially two tubes become one with a bend formed at the extreme end thereof.

Although the upper receiving chamber 32 is depicted as offset relative to the evaporation chamber 16, with the angled duct passageway 30, it is to be understood that the chamber may be formed immediately above the evaporation chamber with the interconnecting passageway 30 being vertical. Further, although the term tubular is used with respect to the condensing chamber passageways 34, the term tubular as used hereinafter is to be construed as including any tube-like member, whether circular or rectangular in cross-section.

Figure 2:
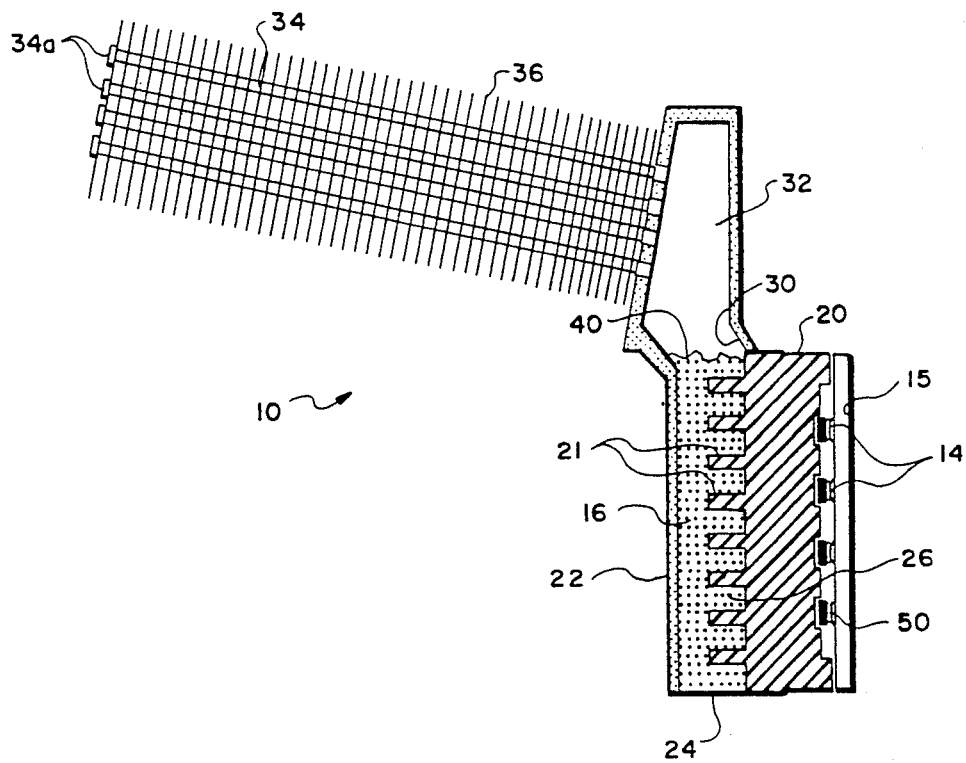
FIG. 2 is a diagrammatic cross-sectional view of the cooling apparatus of FIG. 1 as viewed generally along line 2—2 thereof.

One orientation in use of the unit 10 is as shown in FIG. 2, that is, the cold plate member 20 is aligned in a generally vertical direction with the condensing chamber passageways 34 of the receiving chamber 32 aligned in a generally horizontal direction in a plane above the upper open end 30 of the lower chamber 16. The reason for this, as will be hereinafter described, is due to the requirement that the chamber 16 house the boilable liquid 40 in accordance with the laws of gravity, that is, the chamber 16 is positioned at the low point of the system while the condensing chamber passageways 34 are positioned at a higher point in the system. Another orientation in use of the unit 10 would be to have the cold plate member 20 aligned in a generally horizontal direction with the condensing chamber passageways 34 and the upper chamber 32 aligned in a generally vertical direction in a region above the lower chamber 16.

The chamber 16 forms the evaporating chamber and the passageways 34 form the condensing chamber, which are interconnected internally to each other within the unit 10 via the passageway 30. The chambers 16 and 32, along with the interconnecting passageway 30 and the condensing passageways 34 are formed as a hermetically sealed unit for providing a closed path for directing vapors from the evaporating chamber 16 to the receiving chamber 32, where the vapor enters the condensing passageways 34 and, after air-cooling, via fins 36, changes phase to liquid, which is returned to the lower chamber 16 under the force of gravity.

Figure 3:
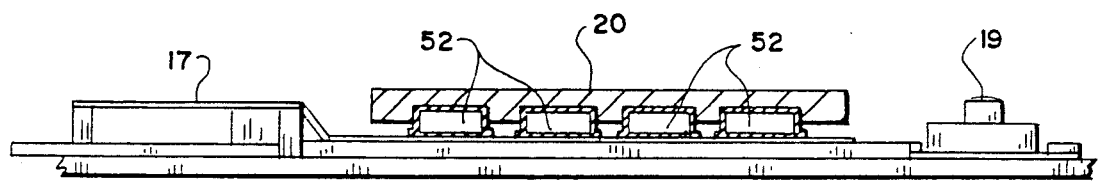
FIG. 3 is a cross-sectional view of the cold plate portion in assembled relation with the heat transfer slugs and board.

The cold plate member 20 has a configuration which is determined, in part, by the configuration of the multi-chip unit 12. As will be described, the external surface of the cold plate member 20 is configured for attachment to the exposed surface of the unit 12 (See also FIG. 4), wherein the perimeter configuration 13 of the unit 12 is somewhat raised relative to a plane drawn through the outer exposed surfaces of the chips 14 on the unit 12. By reference to FIG. 3, the adjuncts about the perimeter 13 include such devices as the power connector 17 and certain mounting hardware 19 which are irrelevant to the invention. In practice, the chips 14 will protrude about 26 mils above the surface of the printed circuit board 15 to which they are attached. The chips 14 may be arranged in any pattern on the surface of the board 15, but, as shown in FIG. 1, the chips 14 are arranged in a symmetrical matrix or array of four chips per row in four rows, with equal side spacing between chips.

The dimensions of the perimeter of the cold plate member 20 are generally determined by the dimensions of the raised perimeter 13 of the unit 12. The external surface of the cold plate member 20 may include at least one cold plate recess or pocket 50 at a location corresponding to the location of the chip 14 to be cooled. As shown in FIG. 1, there is a matrix or array of pockets 50, corresponding in number and location to the array of chips 14 on unit 12. The pockets 50 are configured for receiving therein ceramic substrates such as aluminum nitride slugs 52, which have a main body portion having an outer perimeter slightly less than the inner perimeter of the pockets 50 and an enlarged flange portion 52a with a planar surface in facing relation with the exposed surface of the chips 14. The slugs 52 may be formed of any other ceramic having high thermal conductivity characteristics.

Figure 4:
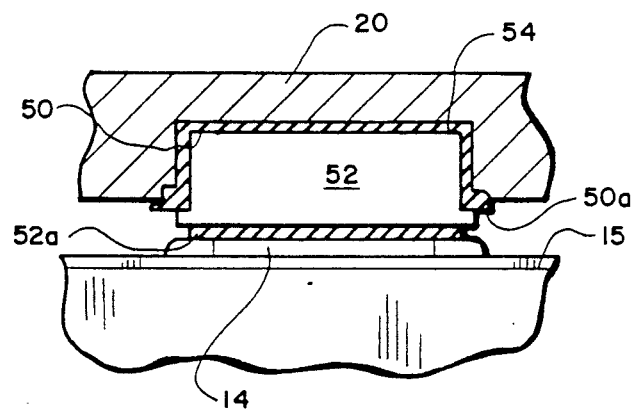
FIG. 4 is an enlarged fragmentary cross-sectional view showing a portion of the cold plate of the cooling apparatus and a single chip of the multi-chip board.

As shown in FIG. 4, the main body portions of the aluminum nitride slugs 52 are received within the pockets 50 and suitably secured, such as by use of solder 54 or some other low thermal resistance adhesive material. The surface of the flange portion 52a is adhered to the surface of the chip 14 by a suitable means, such as a thermally conductive epoxy adhesive or a Si/Au eutectic or solder.

The selection of aluminum nitride as the material for the slugs 52 was based on the property of the material, that is, aluminum nitride is a dielectric having high thermal conductivity, exhibits thermal expansion characteristics that match those of the chips 14 and has sufficient electrical resistance to provide appropriate electrical isolation between the chip and the cooling system which is at ground electrical potential. Alternatively, the electrical isolation could be provided by coating the cold plate with a surface dielectric or using a metallic slug coated with a surface dielectric.

By reference to FIG. 4, the method of attachment of the slugs 52 within the pockets 50 will be described. As can be seen, each pocket 50 is relieved near the open end thereof to provide a peripheral outwardly extending shoulder area 50a. This shoulder provides additional volume within the pocket 50 to facilitate soldering without requiring criticality in the quantity of solder employed per pocket 50.

To apply the solder 54 for attachment of the slugs 52, the unit 10 is positioned vertically so that the cold plate pockets 50 within the cold plate member 20 are facing up. A predetermined amount of low melting point solder 54 is then placed in each pocket 50 depending on the pocket size and depth to which the slug 52 will be inserted into the pocket 50. The solder 54 is then melted and the slugs 52 inserted. During this insertion, the solder will flow toward the open end of the pocket 52 with the excess then moving into the shoulder area 50a. Thereafter, the solder is cooled. Some vibration may be useful to make sure that no air pockets exist between the slugs 52 and the inner walls of the pockets 50. The existence of air pockets in this connection serve to degrade the thermal transfer characteristics. With the slugs 52 thus attached within the pockets 50, the connection enables the pockets 50 to extend the cold plate structure of the cold plate member 20 down and around the slug 52, thereby providing a reduced thermal resistance path from the surface of the chip 14 through the slug 52 around the sides and top of (as seen in FIG. 4) the slug 5 and through the cold plate member 20 to the interior thereof.

Preferably, the slugs 52 are first affixed to the chips 14, with the chips 14 being then electrically affixed to the board 15. Then the whole assembly is secured to the cold plate 20. The chips 14 are either soldered, epoxied or otherwise suitably attached to the slugs 52, with the solder flowing all around the slug.

To effect optimum transfer of the heat from chips 14, the heat transferred through the cold plate member 20 is then transferred to the interior surface of cold plate 20, which serves as one wall of the evaporating chamber 16, the chamber 16 defining a boiling chamber that communicates via interconnecting passageway 30 and receiving chamber 32, with the passageways 34, which serve as an air cooled condenser. The chamber 16 also contains an amount of a working fluid or coolant, heretofore referred to as a boilable liquid 40. The device to be cooled, that is the chips 14 of the unit 12, are mounted to a heat transfer surface, which is the exterior of cold plate 20, the other surface of which is internal to the chamber 16.

The heat passes through the walls of the cold plate pockets 50 and into the cold plate 20, the interior surface of which includes a plurality of fins 21 integrally formed therewith which fins protrude into the boiler chamber 16. The internal fins may take any convenient shape or arrangement, such as bar-shaped, triangular or free-form, and may be arranged in parallel, intersecting or any convenient arrangement. In the embodiment illustrated, the fins 21 are generally bar-shaped metallic members in closely spaced parallel relation, which may be integrally formed on the back or internal surface of the cold plate member 20, the fins 21 being designed to improve the heat energy distribution from the cold plate member to a pool of boilable liquid 40 sealed within the boiling or evaporation chamber 16. The fins 21 substantially increase the surface area between the boilable liquid 40 and the interior of the cold plate member 20.

The coolant or boilable liquid 40 may be, for example, a liquid coolant sold under the brand name of Fluorinert. Almost any other fluid may be chosen for its thermodynamic properties, such as water, glycols, alcohols, and even lower melting point liquid metals. All of these are hereinafter collectively referred to as boilable liquids. The coolant or liquid 40 is preferably disposed in the boiler chamber 16 in an amount sufficient to completely cover the fins 21. Thus, heat energy is transferred from the chips 14 via the aluminum nitride slugs 52, to the cold plate member 20, and to the internal heat sink fins 21, where it is then distributed to the coolant or liquid 40.

The magnitude of the temperature difference between the heat sink fins 21 and the cooling air is a function of the boilable liquid, the condenser size and fin configuration, the air flow through the condenser and other parameters. Since there will be no electronics immersed in the coolant 40, the dielectric properties of the Fluorinert or other boilable liquid are not essential to the invention. This means that other, less expensive coolants with better thermal properties may be used as discussed previously.

In operation, the dissipated heat energy transferred into the evaporation chamber 16 vaporizes the coolant 40 therein, the resulting vapor rising and escaping from the liquid. This vaporization or phase change of the fluid requires a high energy input, at constant temperature, this energy being removed from the cold plate 20 and the fins 21. Due to its low density, the vapor migrates upwards from the chamber 16 through the duct like passageway 30, through receiving chamber 32 and into the condenser portion defined by the passageways 34. The condenser consists of a plurality of cooling passageways 34 with the attached finned structure 36, which operationally connects to a cooling air system. That is, the members 34 and finned structure 36 (See also FIG. 2) are configured for providing air cooling paths via the open spaces between members 34 and fins 36, which air cooling is provided by fans in the computer enclosure. As the vapor rises from the boiling chamber 16 to the condenser passageways 34, it comes into contact with the surfaces thereof. Cooling air passing through the open cooling paths external to the passageways 34 and fins 36 cools the inside of the members 34, thereby condensing the vapor, effecting a phase change back to the liquid phase which, under the force of gravity, returns to the boiling chamber 16 to repeat the cycle. This construction of the unit 10 reduces the series thermal resistance to the point where the air cooled towers formed of components 34 and 36 are sufficient to remove the heat generated by the high power chips 14. In other words, during operation, the liquid plus the heat input produces vapor. The chips 14 generate heat which is conducted into cold plate 20 and heat sink fins 21. This then boils the coolant 40, to produce the vapor. The resulting vapor rises through the liquid coolant 40 through passageway 30 and chamber 32 into condenser passageways 34, where the vapor gives up its heat and reverts to the liquid phase. The liquid then returns, under the force of gravity, to the boiler chamber 16 where the cycle continues to repeat itself. This eliminates the need for a pump.

Electrical connections from the chips 14 to the package or printed circuit board 15 may be made using TAB, PGA or any other comparable technique. The chips 14 and all of the associated hardware are external to the cold plate member 20 and do not contact the fluid 40. There is no need to ever open or disassemble the cold plate member 20 or the unit 10, and the unit 10, complete with coolant 40 therein, may be assembled off line as a complete hermetically sealed unit. Since there are no fluid connections to make or break, the apparatus hereinabove described resembles an air cooled system from a manufacturing or a field service viewpoint.

By separating the chips 14 to be cooled from the coolant 40, a number of important benefits are achieved. An air cooled heat removal apparatus results from the unit 10, one that does not involve any material compatibility issues between the chips 14 and the coolant 40. The chips 14 are in thermal transfer relation with the exterior surface of the cold plate member 20 only, thus simplifying any chip removal or replacement. Lastly, the design of the cold plate pocket 50 and the use of the slugs 52 improves the heat transfer path between the chips 14 and the cold plate member 20, such that, if there are voids in the pockets 50, thermal performance will be only slightly degraded.

In brief, in accordance with the invention shown and described, the cooling of the chips 14 on the multi-chip unit 12 is accomplished by providing an isolated hermetically sealed unit 10 with a sealed chamber 16, which holds a boilable liquid 40, which is physically isolated from the chips 14, thus permitting the selection of a liquid strictly on its economic and heat transferring characteristics. Coupling the liquid with the cold plate recesses or pockets 50, the apparatus permits cooling high-power chips 14 with forced cooling air passing over the fins 36 of the unit 10, with the resulting thermal resistance being very low. Stated in other words, in contrast to the prior art, with the chips 14 physically separated from, rather than immersed in, the boilable fluid 40, the dielectric and corrosive characteristics of the fluid 10 need not be taken into consideration with respect to potential damage or degradation of the chips 14, and need only be considered with respect to the characteristics of the material from which the chambers are constructed. In the preferred embodiment, the chambers and passageways, including the passageways 34 are formed of suitable heat transfer metal material, such as aluminum, brass, copper or the like. In the preferred embodiment, the cold plate member 20 and fins 21 may be constructed of copper to provide maximum heat transfer efficiency for the unit 10.

While there has been shown and described a preferred embodiment, other modifications and improvements may be made within the spirit and scope of the invention.

What is claimed is:

1. Apparatus for removing heat from at least one heat dissipating electronic component comprising:
    heat transfer means having first and second opposed surfaces;
    pocket means within said first surface, said pocket means having a floor and said walls that extend towards but not as far as said second surface;
    at least one thermally conductive member attached to an external surface of said component in heat transfer relation therewith, said at least one thermally conductive member secured in said pocket means to mount said component to said heat transfer means in thermally coupled, electrically isolated therewith, said at least one thermally conductive member substantially filling said pocket means to provide low thermal resistance paths from said component to said floor and sidewalls of said pocket means;
    chamber means including, as part thereof, at least a portion of said heat transfer means;
    a boilable liquid within said chamber means, said liquid being separated from said at least one component and having the characteristic of boiling to generate vapors in response to transfer of heat from said at least one component to said liquid via said heat transfer means;
    said heat transfer means further comprising a plurality of spaced apart heat transfer members protruding from said second surface into said boilable liquid to increase the heat transfer area of said heat transfer means; and
    condensing means in fluid flow connection with said chamber means for enabling condensing of said vapor and gravity return of the condensed fluid to said chamber means.

2. The apparatus according to claim 1 wherein said chamber means and said condensing means are formed as a hermetically sealed unit with said boilable liquid therein.

3. The apparatus according to claim 1 wherein said heat transfer members a comprise fins and said second surface is provided by a plate shaped member forming one wall of said chamber means.

4. The apparatus according to claim 1 wherein said condensing means includes auxiliary heat transfer means on the exterior thereof for exposure to air circulation for enabling cooling of vapors within said condensing means.

5. Apparatus according to claim 1, wherein said at least one thermally conductive member comprises a thermally conductive, dielectric material.

6. Apparatus according to claim 5, wherein said thermally conductive, dielectric material comprises aluminum nitride.

7. Apparatus according to claim 1, wherein a surface coating of dielectric is interposed between said at least one thermally conductive member and said heat transfer means.

8. Apparatus for removing heat from a matrix array of heat dissipating semiconductor devices comprising:
    a chamber including a heat transfer mounting surface external to said chamber, said heat transfer mounting surface having a like matrix of pockets formed therein, said pockets each having a floor and sidewalls that extend into said mounting surface;
    thermally conductive substrate accommodated and secured in respective ones of said pockets, said semiconductor devices attached to said substrate to closely space said semiconductor devices from said heat transfer mounting surface, said thermally conductive substrates providing electrically isolated low thermal resistance paths between said semiconductor devices and said heat transfer mounting surface through said floors sand said side walls of said pockets;
    a plurality of spaced apart heat transfer member extending into said chamber from the surface of said container opposite said heat transfer mounting surface;
    a boilable coolant disposed in said chamber and completely covering said heat transfer fins; and condenser means operatively communicating with said container means to receive said boilable coolant in a gaseous phase from said container means and to condense said boilable coolant from its gaseous phase into it liquid phase.

9. The apparatus according to claim 8 further including passage means for returning the liquid coolant by gravity from said condenser means to said chamber.

10. The apparatus according to claim 9 wherein said condenser means includes an interior chamber means, and said chamber means, said chamber and said passage means are formed as a hermetically sealed unit with said coolant therein.

11. The apparatus according to claim 10 wherein said condenser means includes passage means with external fins and wherein the external fins are exposed to air circulation.

12. The apparatus according to claim 8, wherein said heat transfer members comprise spaced apart fins.

13. Apparatus according to claim 8, wherein said thermally conductive members are comprised of dielectric material.

14. Apparatus according to claim 8, where said electronic devices comprise integrated circuit devices.

15. Apparatus according to claim 8, wherein said thermally conductive members comprise aluminum nitride members having flanges overlapping said first surface adjacent said pockets.

16. Apparatus according to claim 8, wherein a surface coating of dielectric is interposed between said at least one thermally conductive member and said heat transfer means.

* * * * *